United States Patent [19]
Sekiguchi

[11] Patent Number: 5,930,173
[45] Date of Patent: Jul. 27, 1999

[54] NON-VOLATILE SEMICONDUCTOR MEMORY DEVICE HAVING TRAPPED CHARGES PULLED OUT

[75] Inventor: Mitsuru Sekiguchi, Tokyo, Japan

[73] Assignee: NEC Corporation, Tokyo, Japan

[21] Appl. No.: 08/857,038

[22] Filed: May 15, 1997

[30] Foreign Application Priority Data

May 24, 1996 [JP] Japan .................................. 8-153092

[51] Int. Cl.⁶ .............................................. G11C 16/06
[52] U.S. Cl. ........................... 365/185.22; 365/185.29; 365/185.3; 365/218
[58] Field of Search ..................... 365/185.22, 185.18, 365/185.19, 185.29, 185.3, 185.28, 185.26, 218

[56] References Cited

U.S. PATENT DOCUMENTS

| | | | |
|---|---|---|---|
| 5,068,827 | 11/1991 | Yamada et al. | 365/189.01 |
| 5,077,691 | 12/1991 | Haddad et al. | 365/218 |
| 5,272,372 | 12/1993 | Kuzuhara et al. | 257/608 |
| 5,293,062 | 3/1994 | Nakao | 257/638 |
| 5,297,096 | 3/1994 | Terada et al. | 365/218 |
| 5,414,665 | 5/1995 | Kodama | 365/218 |
| 5,452,248 | 9/1995 | Naruke et al. | 365/185 |
| 5,485,423 | 1/1996 | Tang et al. | 365/185 |
| 5,530,669 | 6/1996 | Oyama | 365/185.01 |
| 5,600,593 | 2/1997 | Fong | 365/185.19 |
| 5,615,153 | 3/1997 | Yiu et al. | 365/185.19 |

FOREIGN PATENT DOCUMENTS 4-228193  8/1992  Japan .

Primary Examiner—David Nelms
Assistant Examiner—Tuan T. Nguyen
Attorney, Agent, or Firm—Foley & Lardner

[57] ABSTRACT

In a method of initializing a flash EEPROM, a pre-programming operation of a predetermined data is first performed in a plurality of memory cells of a memory cell array and then an erasing operation is performed to the plurality of memory cells. Then, a verifying operation of whether the erasing operation is correctly performed is performed. During an initializing operation composed of the pre-programming operation, the erasing operation and the verifying operation, electrons or holes trapped in a tunnel oxide film are pulled out.

20 Claims, 14 Drawing Sheets

| | UPON APPLICATION OF ERASURE PULSE | OTHERS |
|---|---|---|
| $\overline{ER}(V_{PP})$ | 0V | $V_{PP}$ |
| $\overline{ER}$ | 0V | $V_{CC}$ |

NON-VOLATILE SEMICONDUCTOR MEMORY DEVICE HAVING TRAPPED CHARGES PULLED OUT

BACKGROUND OF THE INVENTION

1. Field of the Invention

The present invention relates to a non-volatile semiconductor memory device, and more particularly to a non-volatile semiconductor memory device such as a flash electrically erasable programmable read only memory (EEPROM) in which a writing operation and an erasing operation can be electrically performed.

2. Description of the Related Art

In a conventional non-volatile semiconductor memory device such as a flash EEPROM memory in which memory data stored in memory cells can be collectively and electrically erased, there is a problem in that the memory cells are sometimes over-erased during an initializing operation because of the memory structure and the erasing method using tunneling of electrons so that the threshold voltage of the over-erased memory cell becomes negative, that is, the over-erased memory cell is set to the depletion state.

In order to solve this problem, as disclosed in, for example, Japanese Laid Open Patent Disclosure (JP-A-Heisei 4-228193), before the memory cells are collectively initialized in an initializing operation, a pre-programming operation is performed to all the memory cells so that electrons are injected to a floating gate. Thus, the threshold voltage of the floating gate before an erasing operation is started is made to be almost a uniform value of equal to or more than 7 V. Then, a high voltage is applied between the gate and source of a transistor of each of the memory cells to pull out the electrons which are accumulated in the floating gate, using the Fowler-Nordheim tunneling phenomenon. In this manner, the erasing operation of the flash EEPROM is performed.

In the above-mentioned initializing operation, the following method is employed in order to prevent the memory cells from being erased more than necessary, i.e., from being over-erased. That is, the pulse width of the high voltage pulse (hereinafter, to be referred to as "erasure pulse") which is applied to a source line of a transistor of the memory cell for the erasure is made shorter than the pulse width which is necessary to erase the memory cell. Every time the erasure pulse with this short pulse width is applied to the source line, the memory data of all the memory cells in the memory cell array are read out. Then, it is determined whether or not the memory data of all the memory cells in the memory cell array are erased so that the memory cells are in the erasure state. If one or more of the memory cells are not in the erasure state, the erasure pulse with the short pulse width is applied to the source line once again. A test operation which is referred to as an "erasure verifying" operation is performed to determine whether or not the memory data of all the memory cells are erased. This operation is also referred to as an "erasure test I". Such an erasure verifying operation and the application of the erasure pulse to the source line are repeated until all the memory cells in the memory cell array are set to the erasure state.

After the memory data of all the memory cells are erased, it is determined whether or not any over-erased memory cell exists. This operation is referred to as an "erasure test II". When all the memory cells in the memory cell array are not in an over-erased state, the data indicative of completion of the initializing operation is outputted from the non-volatile semiconductor memory device.

On the other hand, if any of the memory cells is in the over-erasure state, the pre-programming operation is performed with a low gate voltage to the memory cells which are connected to the bit line to which the over-erased memory cell is connected, so that the threshold voltages of the memory cells are written backed to the levels capable of performing the normal reading operation. Then, the erasure verifying operation 2 (referred to as an "erasure test III") is performed once again from a potential slightly higher than the potential with which erasure verifying operation 1 (erasure test I) is performed. When all the memory cells are in the erasure state, the data indicative of completion of the initializing operation is output from the non-volatile semiconductor memory device.

In the flash EEPROM, the initializing operation of pre-programming operation, erasing operation, erasure tests I, II, and III are automatically performed in response to an initializing instruction.

FIG. 1 is a block diagram illustrating the structure of a conventional non-volatile semiconductor memory device. Referring to FIG. 1, the conventional non-volatile semiconductor memory device is composed of a memory array 312, an address buffer 306, an X address decoder 311, a Y selection transistor group 310, a sense amplifier 309, an I/O buffer 307, a write circuit 308 and a control circuit 313. The memory array 312 stores data. The address buffer 306 inputs an external address signal and outputs an internal address signal. The X address decoder 311 selects one of word lines W1 to Wn based on the internal address signal outputted from the address buffer 306. The Y selection transistor group 310 selects one of bit lines based on the internal address signal. The sense amplifier 309 amplifies data read from the memory cell which is selected by the X address decoder 311 and the Y selection transistor group 310. The I/O buffer 307 outputs the output of the sense amplifier 309 to a data input/output pin 301. The write circuit 308 writes a data inputted from the data input/output pin 301 in the memory cell which is selected by the X address decoder 311 and the Y selection transistor group 310. The control circuit 313 inputs a chip enable signal, an output enable signal and a power supply voltage Vpp for the data writing operation and generates internal control signals for controlling the operation of address buffer 306, X decoder 311, Y selection transistor group 310, sense amplifier 309, write circuit 308, and I/O buffer 307 output.

FIGS. 2A and 2B are flow chart illustrating the operation of the conventional non-volatile semiconductor memory device. Referring to FIGS. 2A and 2B, when an automatically initializing instruction is inputted (Step 802), the data of $00_H$ (hexadecimal notation) is written in all the memory cells, i.e., is pre-programmed (Steps 804, 806 and 808). After the data of "$00$"$_H$ is written in the last address (Yes in Step 806), an erasing operation is performed.

In the erasing operation, the pulse width of an erasure pulse which is applied to the source line for the memory cell erasure is made shorter than the pulse width which is actually necessary to erase the memory cell. Each time the erasure pulse with this short pulse width is applied to the source lines once, the memory data of all the memory cells in the memory cell array 312 is read out to determine whether or not the memory data of all the memory cells in the memory cell array 312 are set to an erasure state (Steps 810, 812, 816, and 818). In the erasure test I (step 812) determining whether or not the memory cells are set to the erasure state, when it is determined that there is any erasure failed memory cell, the number of times Ne1 of application of the erasure pulse is incremented by "1" Ne1=Ne1+1, and it is determined whether the number of times Ne1 is larger than a predetermined value (Step 814). When it is determined that the number of times Ne1 is larger than the predetermined value, the memory device is determined to be in the initialization failure state. When it is determined that the number of times Ne1 is not larger than the predetermined value, the erasure pulse is applied to the memory device again in the step 810.

When it is determined that all the memory cells are correctly erased (Step 816), i.e., after the test reaches the last address, the erasure test II determining whether or not there is any over-erased memory cell is performed (Steps 819, 820 and 822). When it is determined that there is any over-erased memory cell (Step 819), a soft write operation, i.e., a write operation of data in the over-erased memory cell with a low gate voltage is performed (Step 824). Then, the erasure test II is performed (Step 826). When it is determined in the step 826 that there is still an over-erased memory cell, the number of times Ne2 is incremented by "1", i.e., Ne2=Ne2+1, and then it is determined whether the number of times Ne2 is larger than a predetermined value (Step 828). When it is determined in the step 828 that the number of times Ne2 is larger than the predetermined value, it is determined that the memory device is in the initialization failure state. On the other hand, when it is determined in the step 828 that the number of times Ne2 is not larger than the predetermined value, the soft write operation is performed again in the step 824.

Then, after the erasure test II is ended, the erasure test III is performed (Steps 834, 836 and 838). When it is determined during the erasure test III that any memory cell is in the failure state, it is determined that the memory device is in the initialization failure state.

When the erasure test III is passed, a status polling operation is performed to read the state of the memory cells (Step 840) and then the initialize mode is reset (Step 842).

In this manner, the automatically initializing operation is ended.

In the conventional automatically initializing operation, there is a problem in that there are electrons which can not be pulled out from the floating gate while the erasing operation is performed or electrons which can not be injected into the floating gate while the write operation is performed. Thus, these electrons are trapped in a tunneling oxide film (these electrons are referred to as "trapped electrons") and there is a problem that these electrons deteriorate the erasure and write characteristics.

Also, when a high voltage is applied to the source of the memory cell for erasure, holes are trapped in the tunnel oxide film (these holes are referred to as "trapped holes"). There is another problem in that the trapped holes cause data holding failure which is a fatal error to the read only memory (ROM).

SUMMARY OF THE INVENTION

The present invention is accomplished in the light of the above circumstances. Therefore, an object of the present invention is to provide an electrically erasable non-volatile semiconductor memory device in which electrons or holes trapped in a tunnel oxide film during an erasing operation or a writing operation can be detrapped.

In order to achieve an aspect of the present invention, a method of initializing a flash EEPROM, includes the steps of:

performing a pre-programming operation of a predetermined data in a plurality of memory cells of a memory cell array;

performing an erasing operation to the plurality of memory cells;

verifying whether the erasing operation is correctly performed; and pulling out electrons or holes trapped in a tunnel oxide film.

When each of the plurality of memory cells has a control gate, a floating gate, a source and a drain, the pulling out step is performed to pull out the trapped electrons by setting the control gate and the source to voltages not influencing to the trapped electrons and the drain is set to a positive voltage lower than a power supply voltage. The method may further include step of determining whether an initializing operation composed of the pre-programming operation, the erasing operation, and the verifying operation is performed a predetermined number of times, and the pulling out step is performed when it is determined that the initializing operation is performed the predetermined number of times. The pulling out step may be performed to pull out the trapped holes by setting the control gate to a voltage not influencing to the trapped holes and the drain and the source are set to negative voltages. Both of the above steps may be performed.

In order to achieve another aspect of the present invention, a flash EEPROM includes a memory cell array composed of a plurality of memory cells, a pre-programming section for performing a pre-programming operation of a predetermined data in the plurality of memory cells of a memory cell array, an erasing section for performing an erasing operation to the plurality of memory cells, a verifying section for verifying whether the erasing operation is correctly performed, a pulling section for pulling out electrons or holes trapped in a tunnel oxide film in response to a pull-out instruction and a control section for issuing the pull-out instruction to the pulling section.

DESCRIPTION OF THE PREFERRED EMBODIMENTS

The non-volatile semiconductor memory device of the present invention will be described below in detail with reference to the accompanying drawings.

Figure 1:
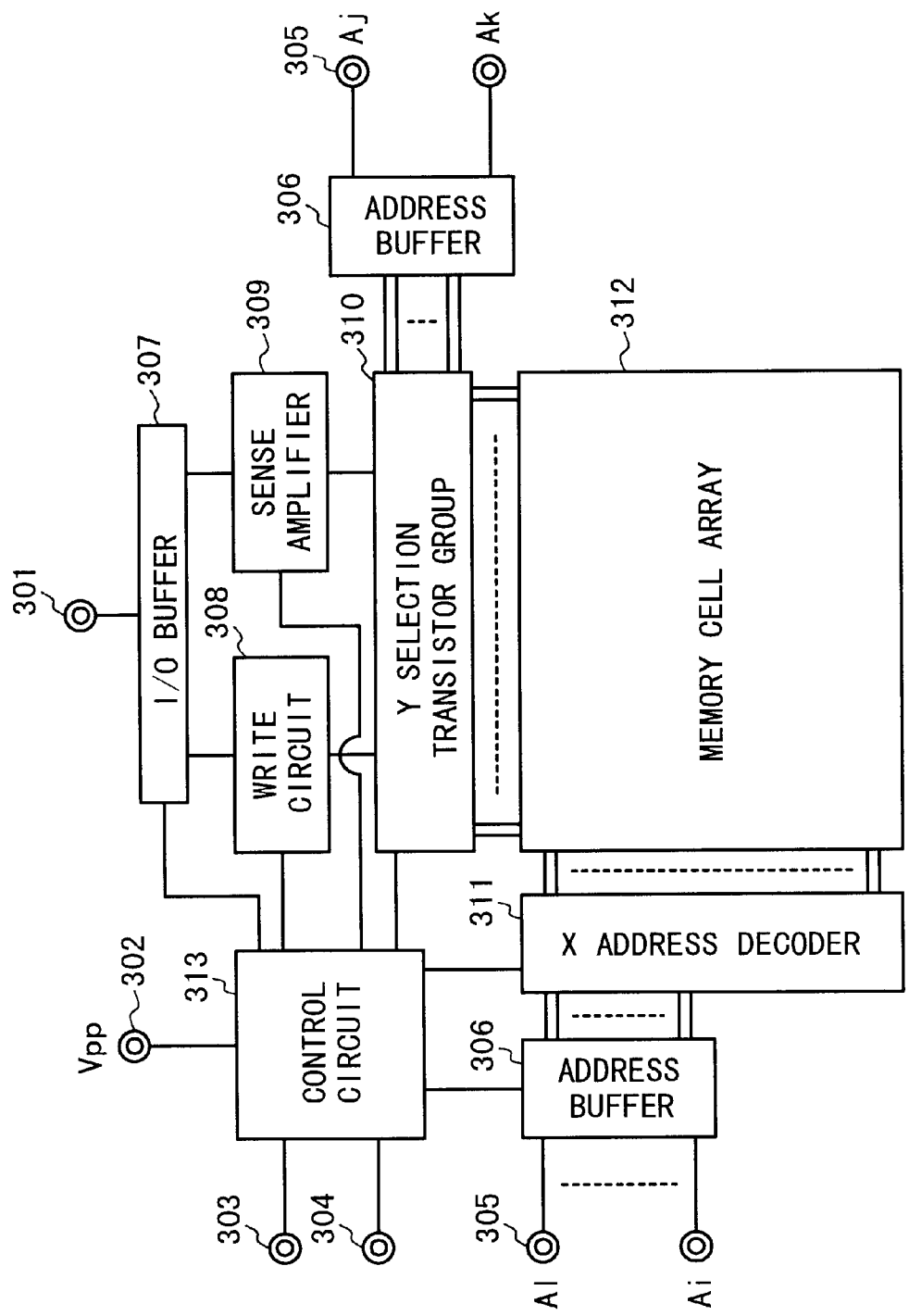
FIG. 1 is a block diagram illustrating the structure of a conventional non-volatile semiconductor memory device.
Figure 2A:
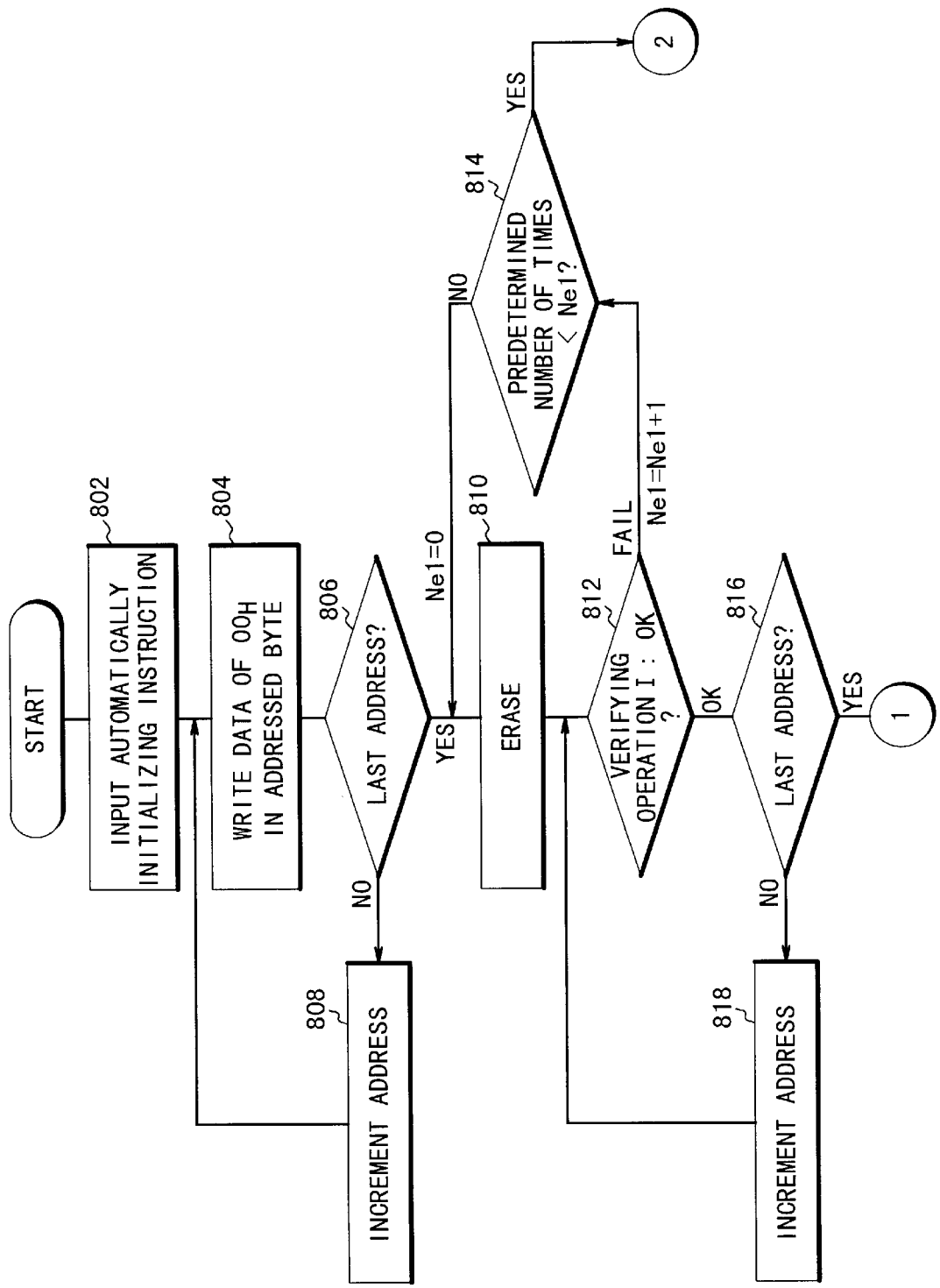
FIGS. 2A and 2B are a flow chart illustrating the automatically initializing operation in the conventional semiconductor memory device shown in FIG. 1.
Figure 2B:
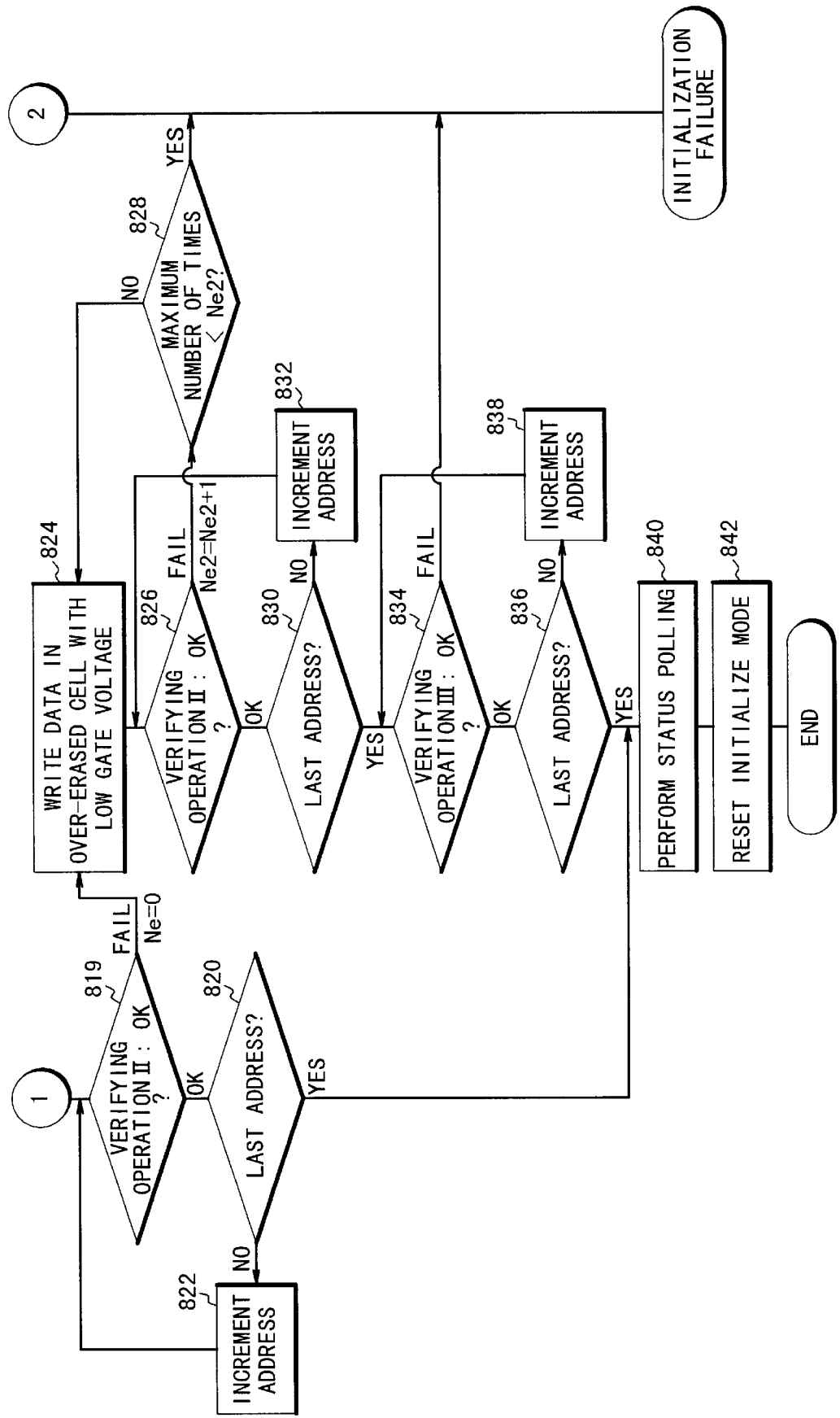
Figure 3:
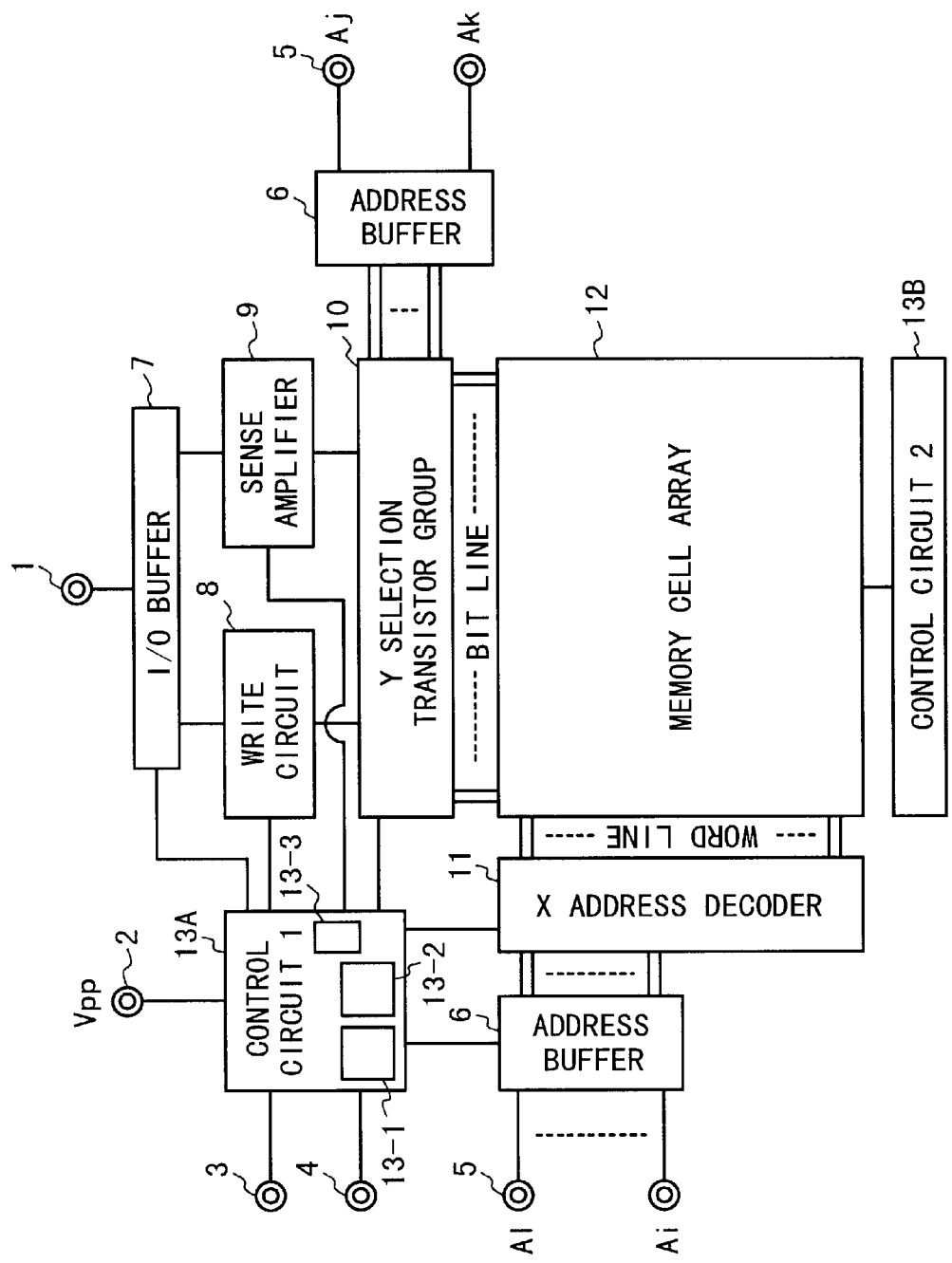
FIG. 3 is a block diagram illustrating the structure of the electrically erasable non-volatile semiconductor memory device of the present invention.

FIG. 3 is a block diagram illustrating the structure of the non-volatile semiconductor memory device of the present invention. Referring to FIG. 3, the non-volatile semiconductor memory device of the present invention is composed of a memory cell array 12, an address buffer 6, an X address decoder 11, a Y selection transistor group 10, a sense amplifier 9, an I/O buffer 7, a write circuit 8 and a control circuit 13 composed of a control circuit 13A and a control circuit 13B.

Figures 4, 5:
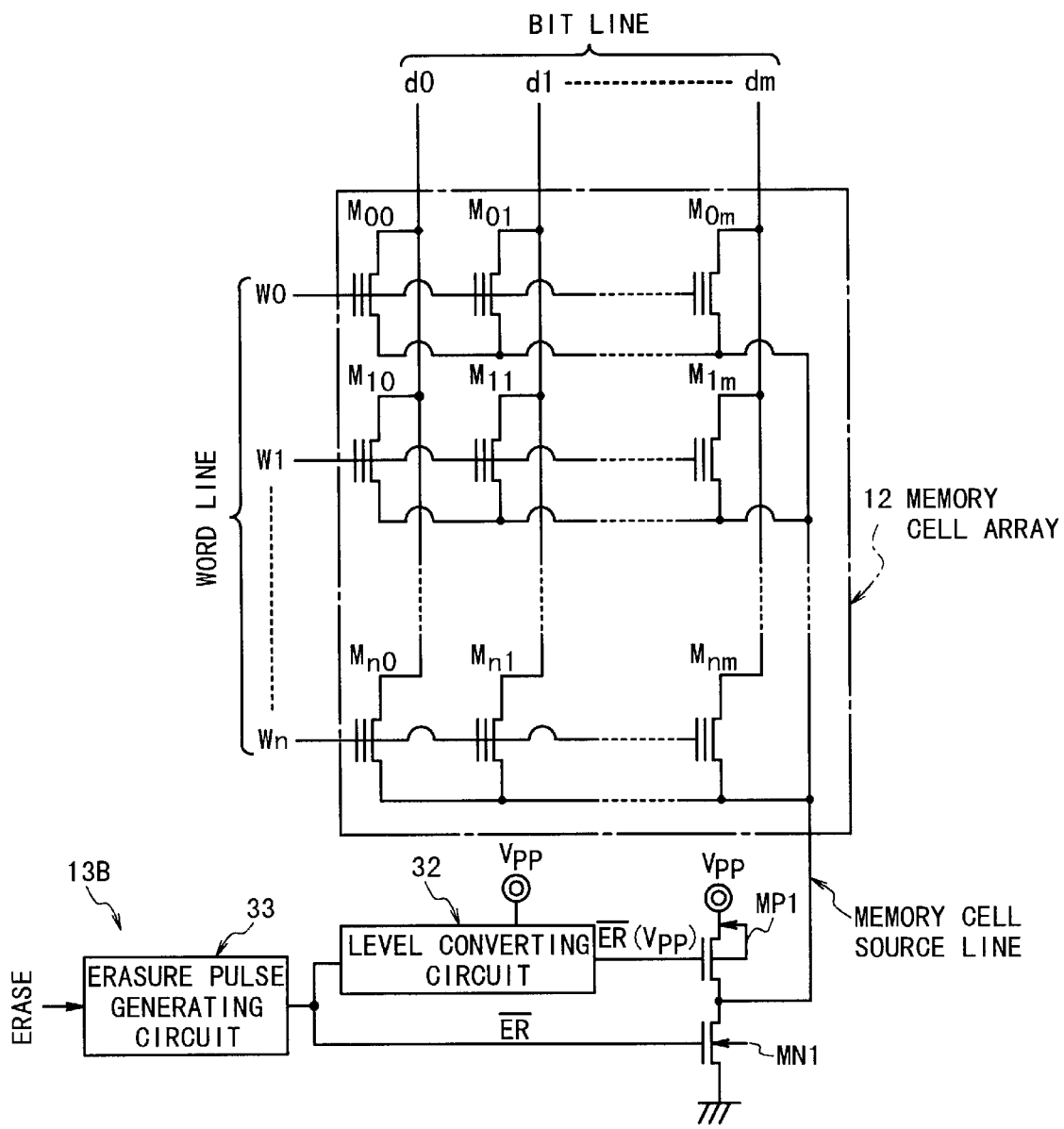
FIG. 4 is a circuit diagram illustrating the structure of a memory cell array and a control circuit in the non-volatile semiconductor device shown in FIG. 3.
FIG. 5 is a table indicating voltages applied to a transistor of a memory cell in the memory cell array.

FIG. 4 is a circuit diagram illustrating the structure of the memory cell array 12 and the control circuit 13B. The memory cell array 12 is composed of a plurality of memory cells M00 to Mnm which are arranged in matrix manner such that the plurality of memory cells are connected to the bit lines d0 to dm and the word lines W0 to Wn.

Figure 10A:
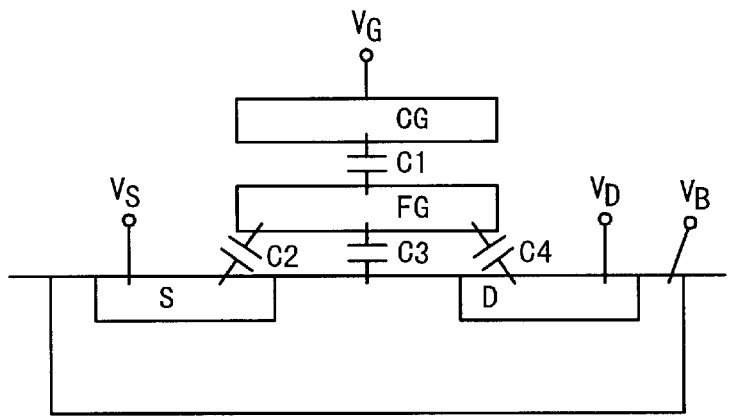
FIG. 10A is a cross sectional view of a memory cell of the non-volatile semiconductor memory device of the present invention.

Each of the memory cells includes a transistor which is composed of a source, a drain, a floating gate (FG) formed on a channel region via a tunneling oxide film, and a control gate (CG) formed on the floating gate via an insulating film, as shown in FIG. 10A. The control gate is connected to a corresponding one of the word lines W0 to Wn. The drain is connected to a corresponding one of the bit lines d0 to dm. The source is connected to a common source line.

FIG. 10A is a schematic cross sectional view of one of the memory cells. Referring to FIG. 10A, the floating gate FG is provided on a channel region between the source S and drain D via the tunneling oxide film. The control gate CG is provided on the floating gate FG via the insulating film. A capacitor C1 is a capacitor between the control gate CG and the floating gate FG and a capacitor C2 is a capacitor between the floating gate FG and the memory cell source S. A capacitor C3 is a capacitor between the floating gate FG and the memory cell channel region of the substrate and a capacitor C4 is a capacitor between the floating gate FG and the memory cell drain D.

The memory array 12 stores memory data. The address buffer 6 inputs an external address signal and outputs an internal address signal. The X address decoder 11 selects one of word lines W0 to Wn based on the internal address signal outputted from the address buffer 6. The Y selection transistor group 10 selects one of bit lines d0 to dm based on the internal address signal. The sense amplifier 9 amplifies data read from the memory cell which is selected by the X address decoder 11 and the Y selection transistor group 10. The I/O buffer 7 outputs the output of the sense amplifier 9 to a data input/output pin 1. The write circuit 8 writes a data inputted from the data input/output pin 1 in the memory cell which is selected by the X address decoder 11 and the Y selection transistor group 10. The control circuit 13A inputs a chip enable signal, an output enable signal and a power supply voltage Vpp for the data writing operation. Also, the control circuit 13A receives an automatic initializing instruction to generate internal control signals for controlling the operations of address buffer 6, X decoder 11, Y selection transistor group 10, sense amplifier 9, writing circuit 8, I/O buffer 7, and the control circuit 13B.

Referring to FIG. 4, the control circuit 13B is composed of an erasure pulse generating circuit 33 for generating an erasure pulse ER* in response to an erasure pulse activating signal ERASE from the control circuit 13A, a level converting circuit 32 for converting the level of a source line control signal ER* into the high voltage Vpp, a P-channel MOS transistor MP1 connected to the high voltage Vpp and an N-channel MOS transistor MN1 connected between the drain of the P-channel MOS transistor and the ground. A node between the P-channel MOS transistor MP1 and the N-channel MOS transistor MN1 is connected to the source line common to all the memory cells in the memory cell array 12.

The source line activating signal ER* ("*" indicates the active-low signal) generated by the erasure pulse generating circuit 33 is applied to the gate of the N-channel MOS transistor MN1 as it is. The level converting circuit 32 generate a signal ER*(Vpp) in response to the signal ER*. The signal ER*(Vpp) is applied to the gate of the P-channel MOS transistor MP1. Therefore, as shown in FIG. 5, when the erasure pulse is applied to the memory cells, the signal ER*(VPP)and signal ER* are both set to 0 V. On the other hand, when the erasure pulse is not applied to the memory cells, the signal ER*(Vpp) is set to the voltage of Vpp and the signal ER* is set to the Vcc, so that the memory cell source line is set to the ground voltage.

Figure 6A:
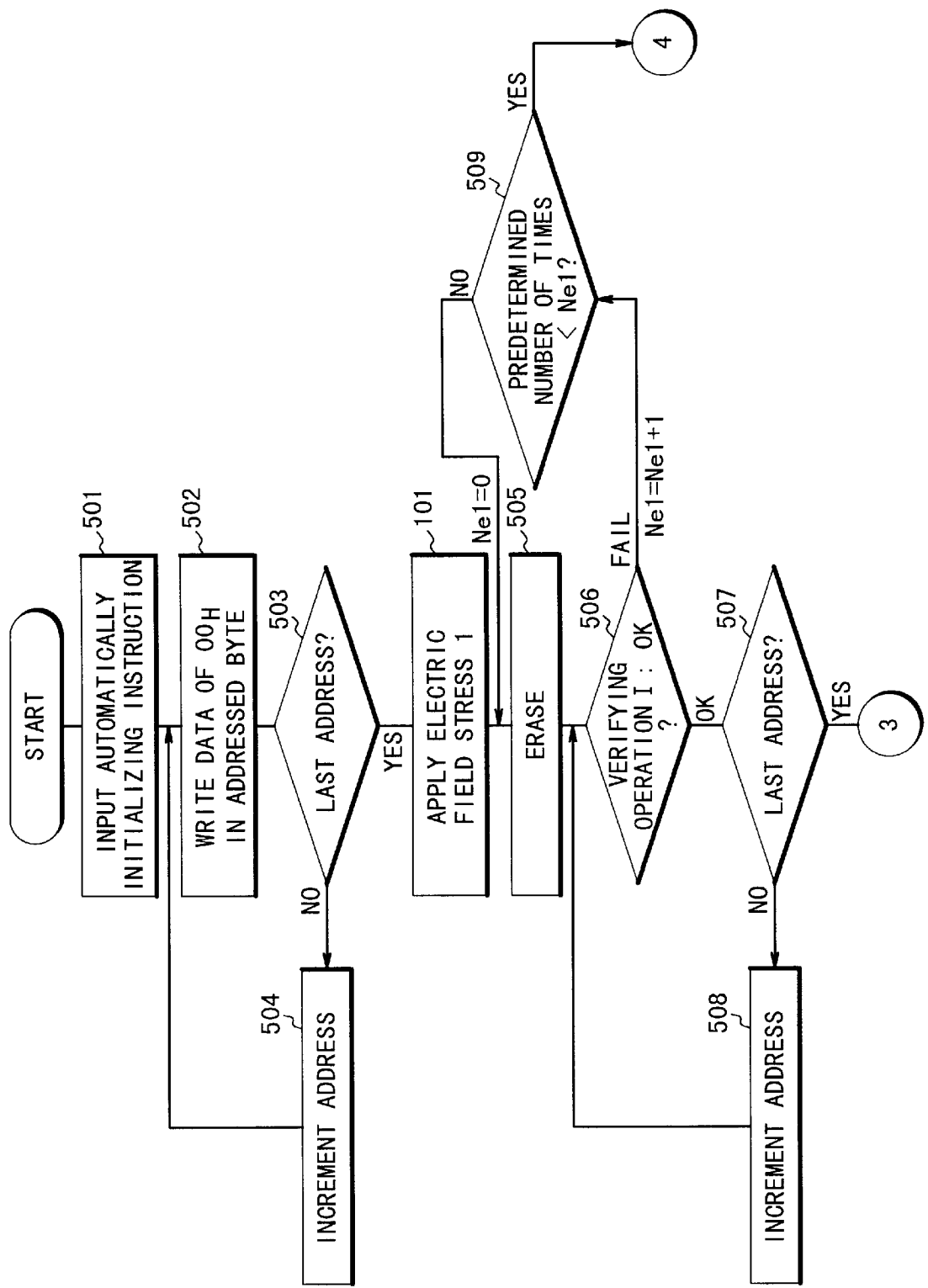
FIGS. 6A and 6B are a flow chart illustrating the automatic initializing operation in the non-volatile semiconductor memory device according to the first embodiment of the present invention.
Figure 6B:
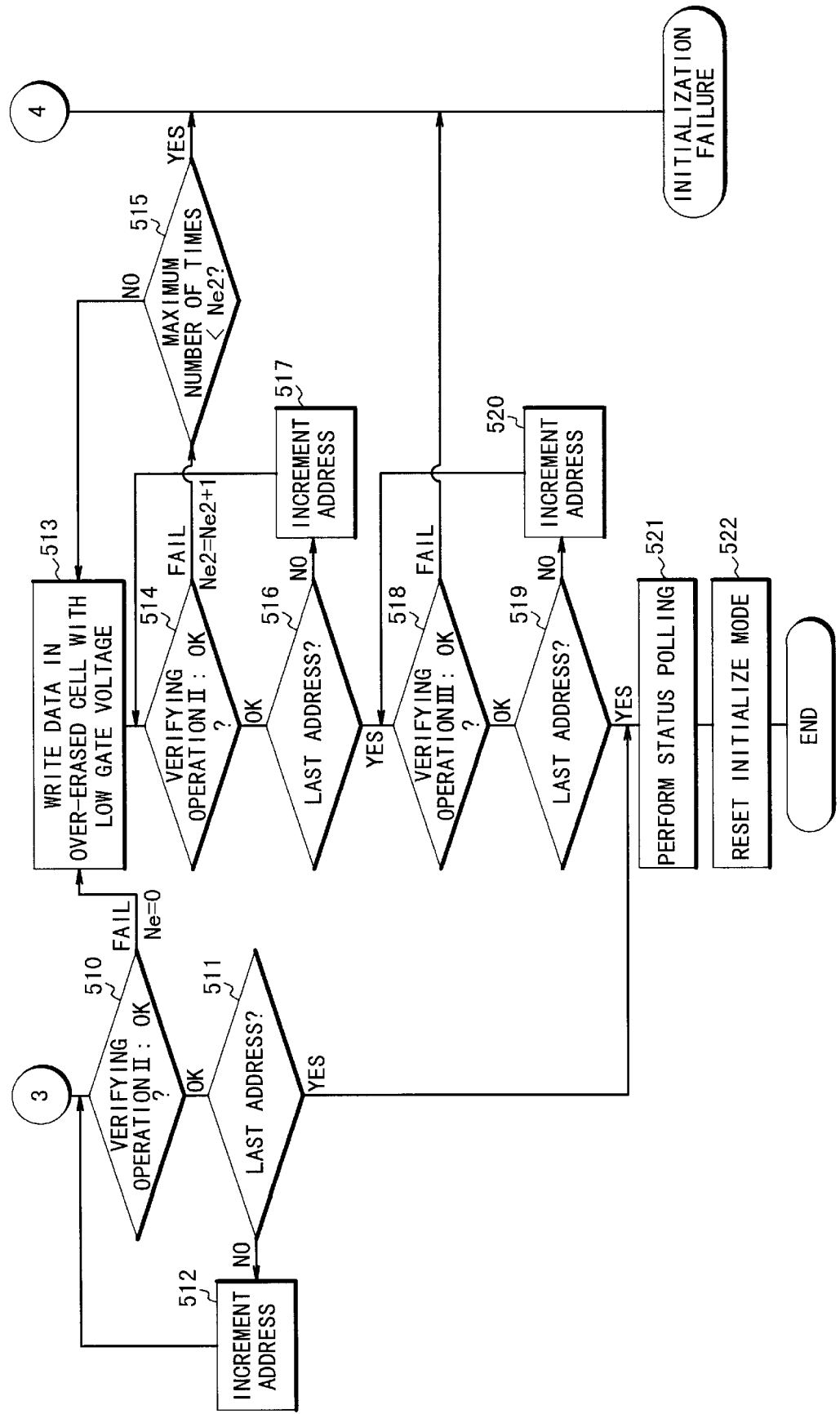

FIGS. 6A and 6B are a flow chart illustrating the operation of the non-volatile semiconductor memory device in the first embodiment. Referring to FIGS. 6A and 6B, when an automatically initializing instruction is inputted to the control circuit 13, an initialize mode is set (Step 501). A data $00_H$ (hexadecimal notation) is written or pre-programmed in a currently addressed byte (Step 502). In order to write the data, the word line is applied with the voltage Vpp, e.g., 12 V. When the pre-programming operation is performed, the erasure signal ER* is inactive and set to the voltage of Vcc. The level converting circuit 32 converts the ER* having the voltage Vcc into the ER*(Vpp) having the voltage of Vpp. Thus, the ER*(Vpp) of Vpp and the ER* of Vcc are applied to the gate of the P-channel MOS transistor MP1 and the gate of the N-channel MOS transistor MN1, respectively. As a result, the memory cell source line is set to the ground, i.e., 0 V. The bit line is set to the voltage in a range 6 to 7 V. The substrate is set to the ground. In a step 503, it is determined whether the current address is the last address. If the answer is No, the step 504 is executed to increment the current address by "1". Then, the step 502 is executed again. If the answer is Yes, that is, the data 00H is written in all the bytes, a step 101 is executed.

Figure 10B:
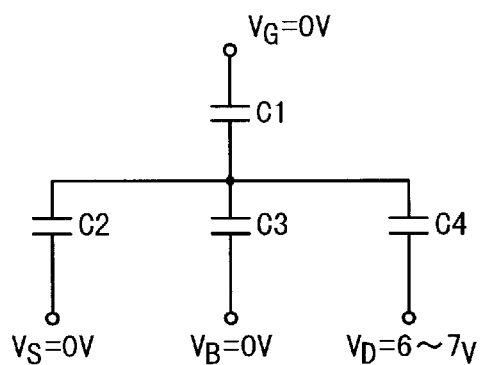
FIG. 10B is a circuit diagram illustrating an equivalent circuit when the first electric field stress of the present invention is applied to the memory cell shown in FIG. 10A.

In the step 101, electric field stress 1 is applied to the memory device to pull out electrons trapped in the tunneling oxide film. That is, the word lines and the substrate are set to the voltage of 0 V, i.e., the ground potential. The bit lines are set to the voltage in a range of 6 to 7 V. Because the application of the electric field stress 1 is not the application of the erasure pulses the memory cell source line is set to the ground potential. i.e. 0 V. The manner which the electric field stress 1 is applied to the memory device is shown in FIG. 10B.

After the electric field stress 1 is applied, the erasing operation of the memory cells is executed in a step 505, such that the memory data stored in all the memory cells are erased. That is, the erasure pulse generating circuit 33 generates the erasure pulse ER* of 0V to have the pulse width shorter than the time period which is necessary actually to erase the memory cell. The erasure pulse ER* of 0V is supplied to the level converting circuit 32 which outputs the ER*(Vpp) of 0V. The signal ER*(Vpp) of 0V and the erasure pulse ER* of 0V are applied to the gate of the P-channel MOS transistor MP1 and the gate of the N-channel MOS transistor MN1, respectively. As a result, the memory cell source line is set to the voltage of Vpp, i.e., 12V. The word line is connected to the ground, and the substrate is connected to the ground.

Subsequently, a step 506 is executed to perform a verifying operation I to determine whether or not the memory data of all the memory cells in the memory cell array 12 are erased. In the verifying operation I, the memory data of all the memory cells are sequentially read out while the address is updated in the steps 507 and 508. In case of reading out of the memory data, because the erasure pulse is not generated, the signal ER* has the voltage of Vcc, as in the pre-programming operation described above. As a result, the memory cell source line is set to the ground potential. The word line is set to the voltage of Vcc, the bit line is set to the voltage of 1V, and the substrate is set to the ground potential.

If it is determined in the step 506 that the erasure operation is failed, the counter 13-1 is incremented by "1". Then, a step 509 is executed to determine whether or not the count Ne1 of the counter 13-1 is larger than the predetermined number of times. If the answer is Yes, it is determined that the memory device is in the initialization failure state, and the initialization operation is ended. If the answer is No in the step 509, the step 505 is again executed such that the erasure pulse is applied to the memory cells.

When the answer is Yes in the step 506, it is determined in the step 507 whether or not a current address is the last address. If the answer is No in the step 507, the step 508 is executed to increment the current address by "1". If the answer is Yes in the step 507, a step 510 is executed.

In the step 510, a verifying operation II is executed to determine whether or not there is any over-erased memory cell. If it is determined that an addressed memory cell is the over-erased memory cell, the control goes to a step 513.

If it is determined in the step 510 that the addressed memory cell is not the over-erased memory cell, it is determined in a step 511 whether or not a current address is the last address. If the answer is No, a step 512 is executed such that the current address is incremented by "1", and then the step 510 is executed again. If the answer is Yes in the step 511, a step 521 is executed.

In the step 513, memory data are written in the memory cells connected to the bit line to which the over-erased memory cell is connected. At this time, the memory data is written with a low voltage applied to the gates of the transistors of the memory cells. Then, a verifying operation II is executed to the memory cells to determined whether or not the over-erased state is eliminated. If the answer is NO, the counter 13-2 is incremented by "1", and it is determined in a step 515 whether or not the count Ne2 of the counter 13-2 is larger than the predetermined maximum number of time. If the answer is Yes, it is determined that the memory device is in the initialization failure and then the initializing operation is ended. If the answer is No in the step 515, the step 513 is executed again.

In the step 514, if the answer is Yes, i.e., the over-erased state is eliminated, it is determined in a step 516 whether a current address is the last address. If the answer is No, the current address is incremented by "1" in a step 517 and then the step 514 is executed again.

When it is determined to be Yes in the step 516, a verifying operation III is performed to all the memory cells in steps 518, 519 and 520. If any memory cell is found to be not correctly erased during the verifying operation in the step 518, it is determined that the memory device is in the initialization failure state and then the initializing operation is ended. If the verifying operation III is completed, the step 521 is executed.

In the step 521, a status polling operation is performed. Subsequently, after the data indicative of completion of initialization is outputted, the initialize mode is reset in a step 522.

In this manner, electrons trapped in the tunneling oxide film can be pulled out.

Next, the non-volatile semiconductor memory device according to the second embodiment of the present invention will be described. The memory device in the second embodiment has the same structure as in the first embodiment. Also, the operation is almost the same as in the first embodiment. Therefore, the same steps are assigned with the same numerals to omit the description, and only the different point from the first embodiment will be described.

Figure 7A:
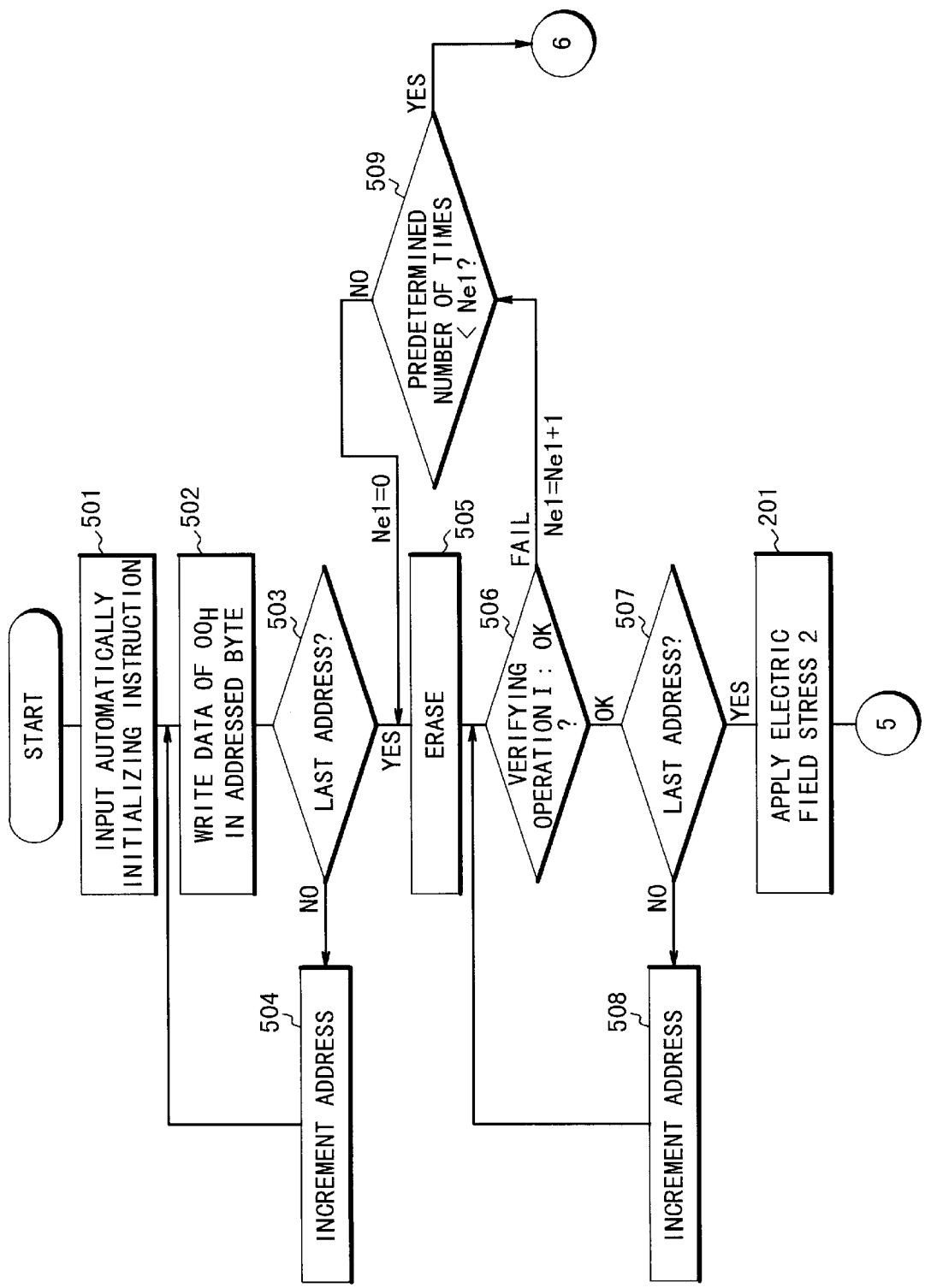
FIGS. 7A and 7B are a flow chart illustrating the automatic initializing operation in the non-volatile semiconductor memory device according to the second embodiment of the present invention.
Figure 7B:
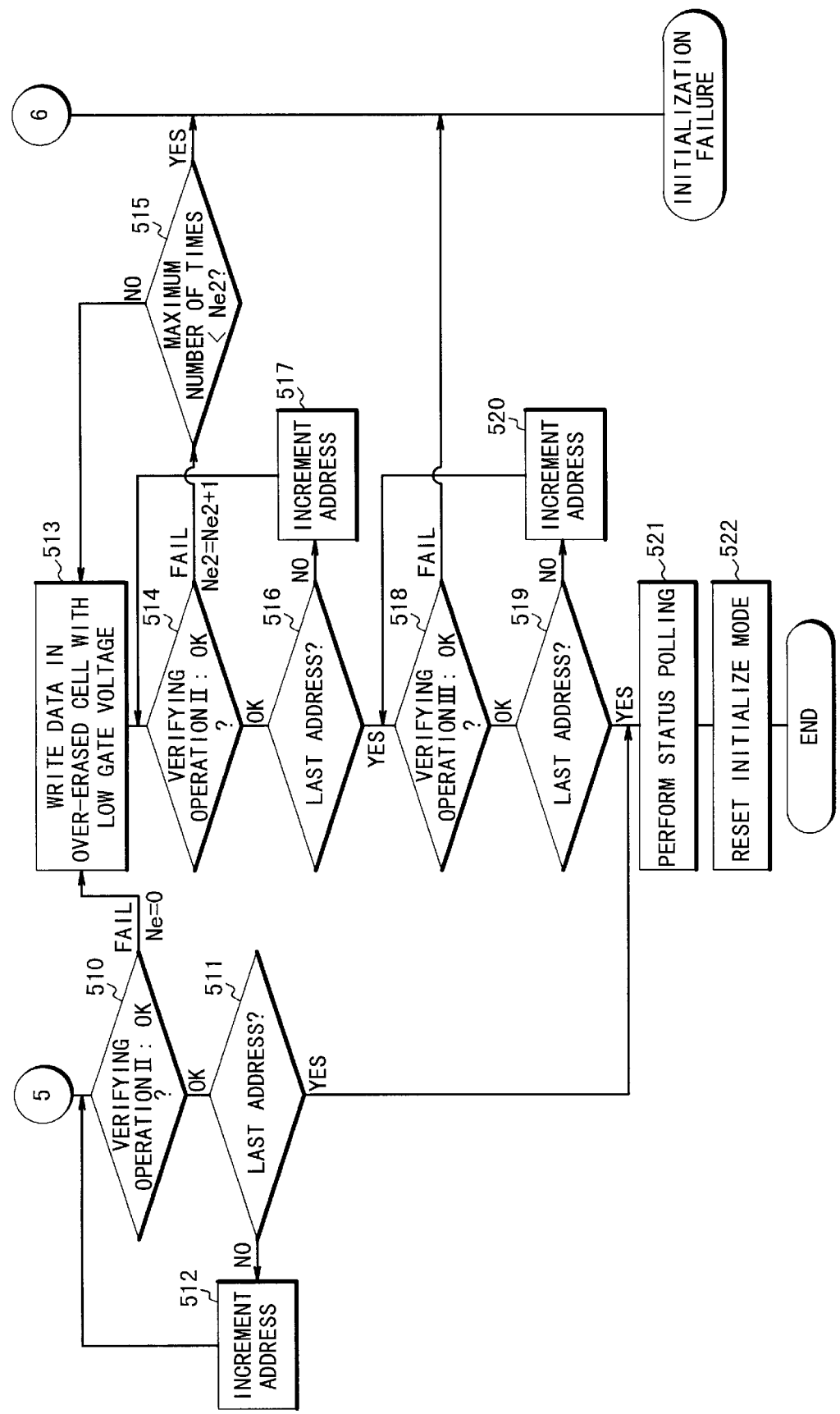

FIGS. 7A and 7B are a flow chart illustrating the initialization operation in the semiconductor memory device in the second embodiment. In the second embodiment, the step 101 is not executed, and instead, a step 201 is executed when the answer is Yes in the step 507, as shown in FIG. 7A.

Figure 10C:
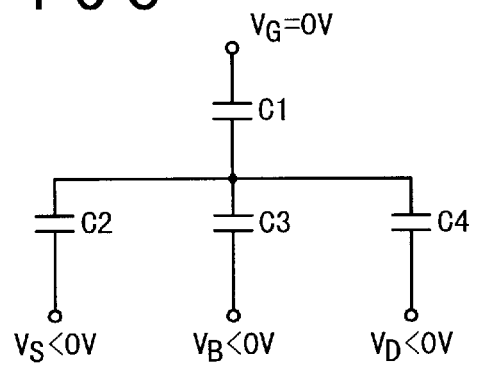
FIG. 10C is a circuit diagram illustrating an equivalent circuit when the second electric field stress of the present invention is applied to the memory cell shown in FIG. 10A.

In the step 201, electric field stress 2 is applied to the memory device. For this purpose, the word lines are set to the voltage of 0V. The memory cell source line, the bit lines and the substrate are set to negative voltages. The manner that the electric field stress 2 is applied is shown in FIG. 10C. In this manner, holes trapped in the tunneling oxide film can be pulled out.

Next, the non-volatile semiconductor memory device according to the third embodiment of the present invention will be described. The memory device in the third embodiment has the same structure as in the first embodiment but the operation is different from that in the first embodiment.

Figure 8A:
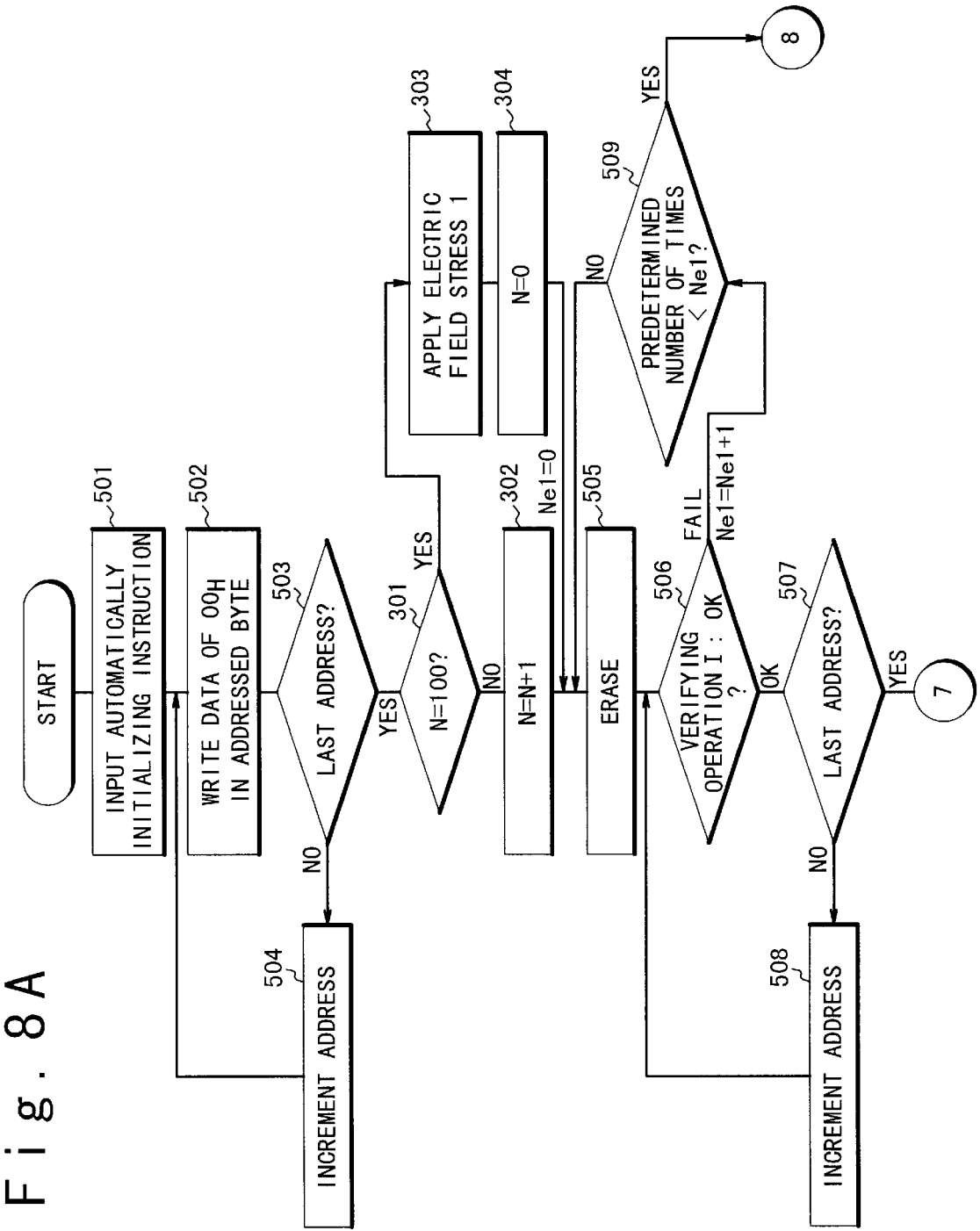
FIGS. 8A and 8B are a flow chart illustrating the automatic initializing operation in the non-volatile semiconductor memory device according to the third embodiment of the present invention
Figure 8B:
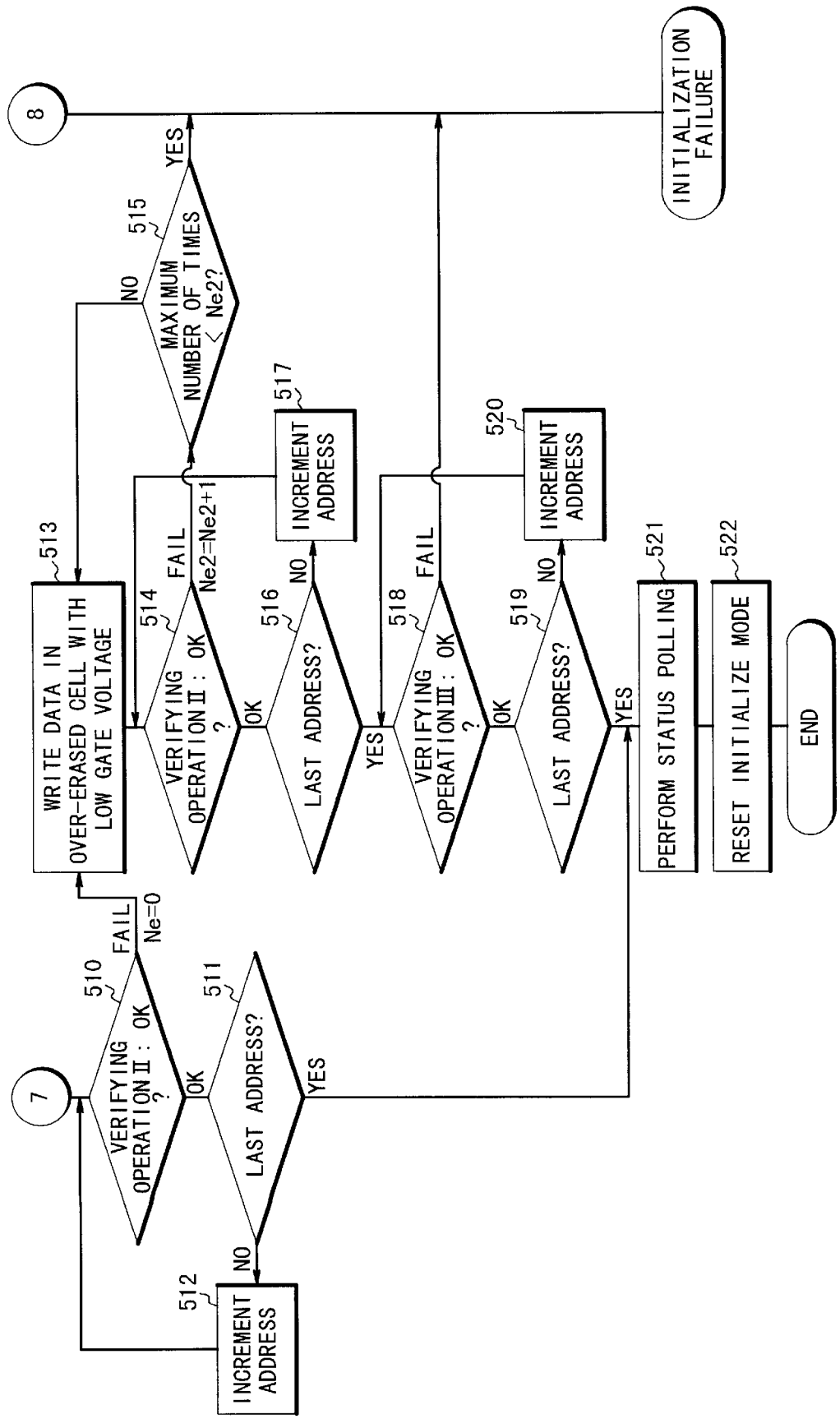

FIGS. 8A and 8B are a flow chart illustrating the initialization operation in the semiconductor memory device in the third embodiment. In the third embodiment, the step 101 is not executed, and instead, steps 301 to 304 are executed when the answer is Yes in the step 503, as shown in FIG. 8A.

In the step 301, it is determined whether or not the count N of the counter 13-3 is equal to a predetermined value, i.e., 100. If the answer is NO, the counter 13-3 is incremented by "1" and subsequently the step 505 is executed. If the answer is Yes in the step 301, the electric field stress 1 is applied to the memory device as in the first embodiment. That is, the word lines, the memory cell source line, and the substrate are set to the ground potential. The bit lines are set the voltage in a range of 6 to 7 V. In this manner, electrons trapped in the tunneling oxide film can be detrapped and pulled out. The counter 13-3 can hold the count N even if the power to the memory device is turned off. Therefore, in this example, each time the initializing operation is performed 100 times, the electric field stress 1 is applied to the memory device.

Next, the non-volatile semiconductor memory device according to the fourth embodiment of the present invention will be described. The memory device in the fourth embodiment has the same structure as in the second embodiment but the operation is different from that in the second embodiment.

Figure 9A:
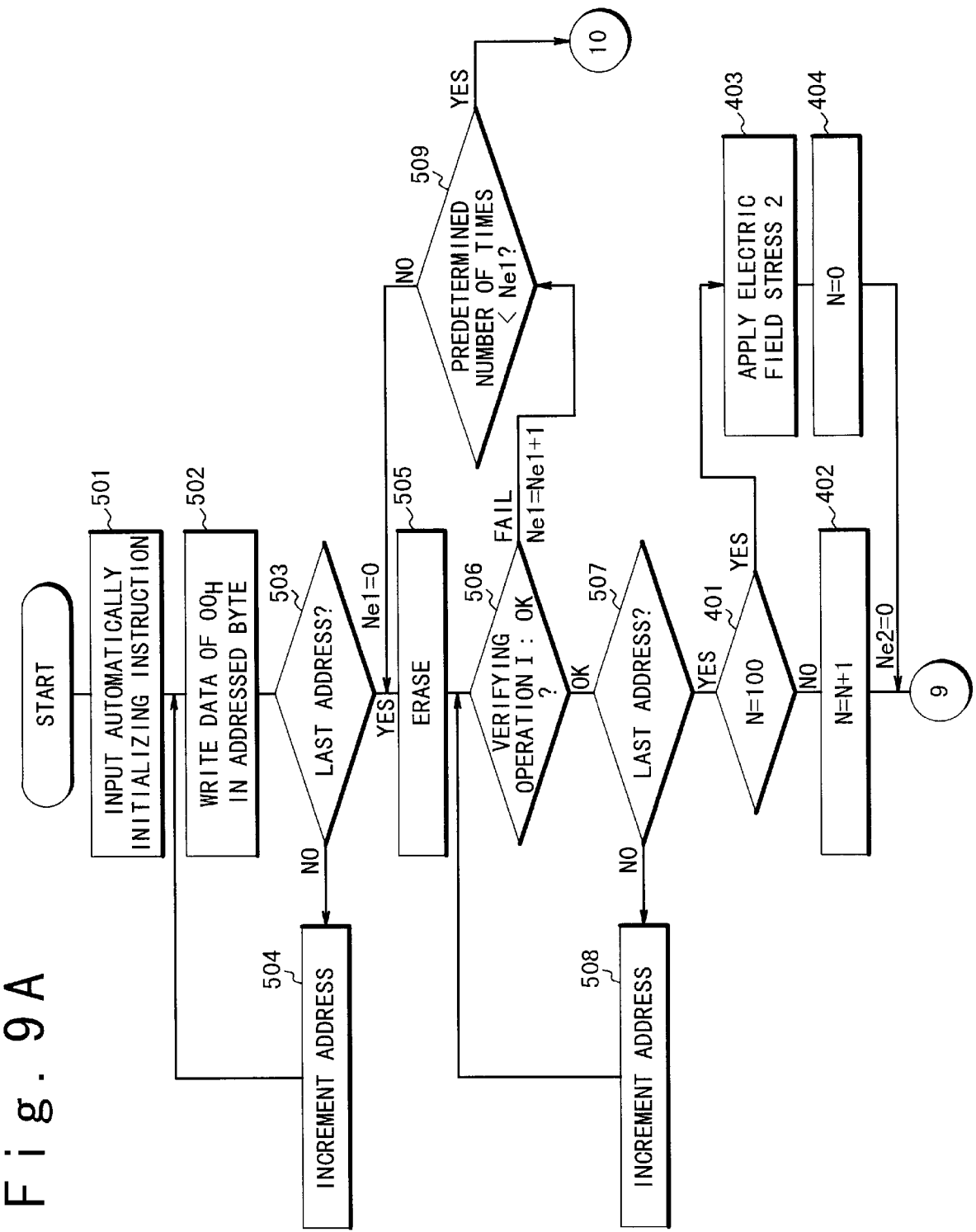
FIGS. 9A and 9B are a flow chart illustrating the automatic initializing operation in the non-volatile semiconductor memory device according to the fourth embodiment of the present invention.
Figure 9B:
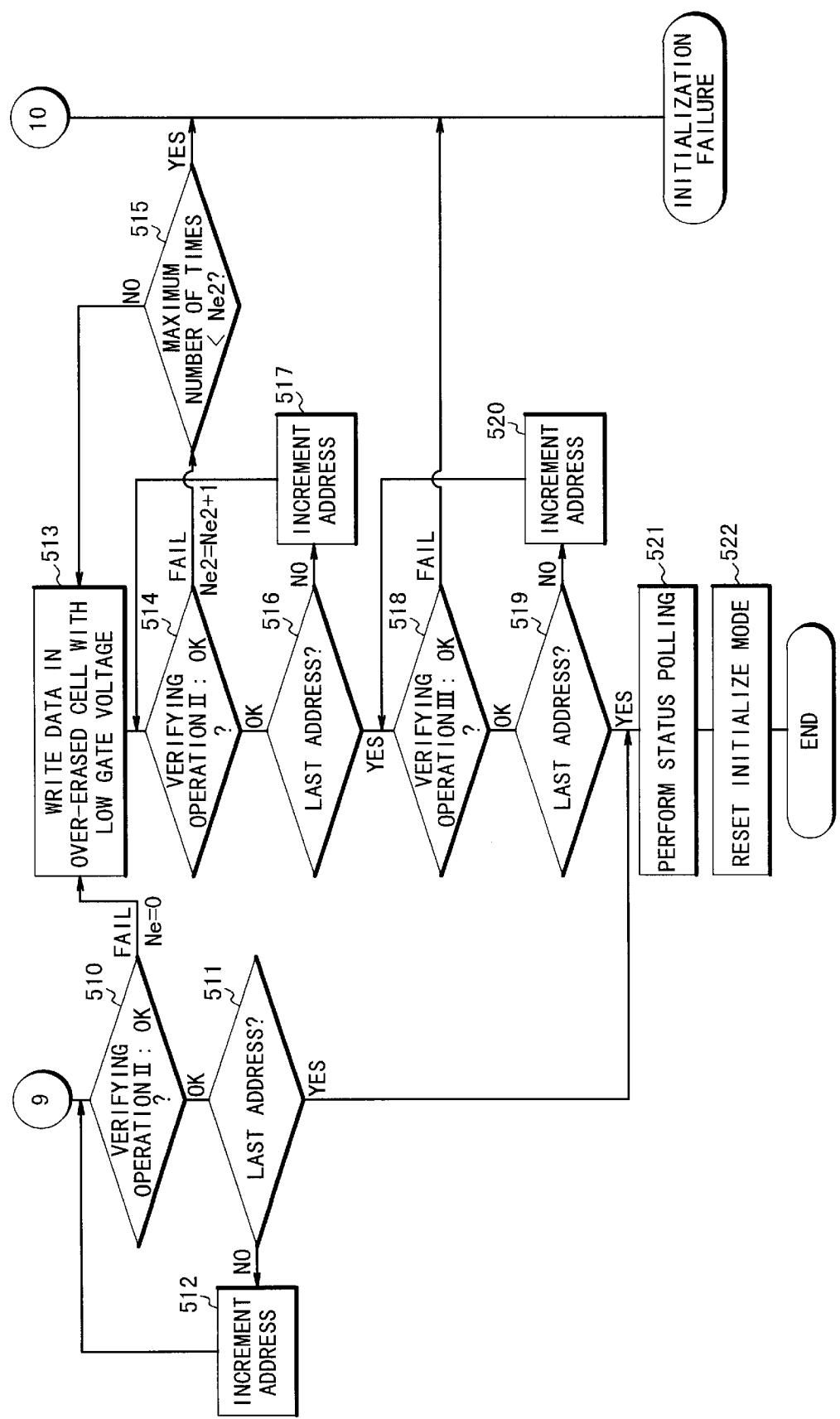

FIGS. 9A and 9B are a flow chart illustrating the initialization operation in the semiconductor memory device in the fourth embodiment. In the fourth embodiment, the step 201 is not executed, and instead, steps 401 to 404 are executed when the answer is Yes in the step 507, as shown in FIG. 9A.

In the step 401, it is determined whether or not the count of the counter 13-3 is equal to a predetermined value, i.e., 100. If the answer is NO, the counter 13-3 is incremented by "1" and subsequently the step 510 is executed. If the answer is Yes in the step 401, the electric field stress 2 is applied to the memory device as in the second embodiment. That is, the word lines are set to the voltage of 0V. The memory cell source line, the bit lines and the substrate are set to negative voltages. In this manner, holes trapped in the tunneling oxide film can be detrapped and pulled out.

As described above, according to the present invention, charges trapped in the tunneling oxide film can be detrapped and pulled out by applying electric field stress each time the initializing operation is performed or when the initializing operation is performed a predetermined number of times. As a result, the deterioration of characteristic of the writing and erasure can be prevented and the holding fault or the decrease of the threshold voltage can be also prevented which is fatal to a ROM.

Also, it could be understood to the skilled person in the art that the first to fourth embodiments may be combined.

What is claimed is:

1. A method of initializing a flash EEPROM, comprising the steps of:
   performing a pre-programming operation of a predetermined data in a plurality of memory cells of a memory cell array;
   performing an erasing operation to the plurality of memory cells;
   verifying whether the erasing operation is correctly performed; and
   extracting holes trapped in a tunnel oxide film.

2. A method according to claim 1, further comprising the step of extracting electrons trapped in the tunnel oxide film, wherein each of the plurality of memory cells has a control gate, a floating gate, a source and a drain, and wherein said extracting step is performed to extract trapped electrons by setting the control gate and the source to 0 V and the drain is set to a positive voltage lower than a power supply voltage.

3. A method according to claim 2, further comprising the step of determining whether an initializing operation composed of the pre-programming operation, the erasing operation, and the verifying operation has been performed a predetermined number of times, wherein said extracting step is performed when it is determined that the initializing operation has been performed the predetermined number of times.

4. A method according to claim 1, wherein each of the plurality of memory cells has a control gate, a floating gate, a source and a drain, and wherein said extracting step is performed to extract trapped holes by setting the control gate to a voltage which does not affect the trapped holes and the drain and the source are set to negative voltages.

5. A method according to claim 4, further comprising the step of determining whether an initializing operation composed of the pre-programming operation, the erasing operation, and the verifying operation has been performed a predetermined number of times, wherein said extracting step is performed when it is determined that the initializing operation has been performed the predetermined number of times.

6. A method according to claim 2, wherein said extracting step is performed to extract trapped holes by setting the control gate to a voltage which does not affect the trapped holes and the drain and the source are set to negative voltages.

7. A method according to claim 6, further comprising the step of determining whether an initializing operation composed of the pre-programming operation, the erasing operation, and the verifying operation has been performed a predetermined number of times, wherein said extracting step is performed when it is determined that the initializing operation has been performed the predetermined number of times.

8. A flash EEPROM, comprising:
   a memory cell array composed of a plurality of memory cells;
   pre-programming means for performing a pre-programming operation of a predetermined data in the plurality of memory cells of a memory cell array;
   erasing means for performing an erasing operation to the plurality of memory cells;
   verifying means for verifying whether the erasing operation is correctly performed;
   hole extracting means for extracting holes trapped in a tunnel oxide film in response to an extracting instruction; and
   control means for generating the extracting instruction to said hole extracting means.

9. A flash EEPROM according to claim 8, further comprising an electron extracting means for extracting electrons trapped in the tunnel oxide film in response to the extracting instruction, wherein each of the plurality of memory cells has a control gate, a floating gate, a source and a drain, and wherein said electron extracting means responds to the extracting instruction to set the control gate and the source to voltages which do not affect the trapped electrons and the drain to a positive voltage lower than a power supply voltage.

10. A flash EEPROM according to claim 9, wherein said control means generates said extracting instruction to said electron extracting means after a write operation and before said erasing operation.

11. A flash EEPROM according to claim 9, wherein said control means includes:
   a counter for counting a number of times of execution of an initializing operation composed of the pre-programming operation, the erasing operation, and the verifying operation; and
   determining means for determining based on the count of the counter whether the execution of the initializing operation has been performed a predetermined number of times,
   wherein said control means issues the extracting instruction to said electron extracting means when it is determined that the initializing operation has been performed the predetermined number of times.

12. A flash EEPROM according to claim 8, wherein each of the plurality of memory cells has a control gate, a floating gate, a source and a drain, and wherein said hole extracting means responds to the extracting instruction to set the control gate to a voltage which does not affect the trapped holes, and the drain and the source are set to negative voltages.

13. A flash EEPROM according to claim 12, wherein said control means issues the extracting instruction to said hole extracting means after said erasing operation.

14. A flash EEPROM according to claim 12, wherein said control means includes:
- a counter for counting a number of times of execution of an initializing operation composed of the pre-programming operation, the erasing operation, and the verifying operation; and
- determining means for determining based on the count of the counter whether the execution of the initializing operation has been performed a predetermined number of times, wherein said control means issues the extracting instruction to said hole extracting means when it is determined that the initializing operation has been performed the predetermined number of times.

15. A flash EEPROM according to claim 9, wherein said electron extracting means responds to a first instruction of the extracting instruction to set the control gate and the source to voltages which do not affect the trapped electrons and the drain is set to a positive voltage lower with respect to a power supply voltage, and said hole extracting means responds to a second instruction of the extracting instruction to set the control gate to a voltage which does not affect the trapped holes, and the drain and the source are set to negative voltages.

16. A flash EEPROM according to claim 15, wherein said control means issues the first instruction to said electron extracting means after said pre-programming operation and before said erasing operation, and the second instruction to said hole extracting means after said erasing operation.

17. A flash EEPROM according to claim 16, wherein said control means includes:
- a counter for counting a number of times of execution of an initializing operation composed of the pre-programming operation, the erasing operation, and the verifying operation; and
- determining means for determining based on the count of the counter whether the execution of the initializing operation has been performed a predetermined number of times, wherein said control means issues the first and second instructions to said electron and hole extracting means when it is determined that the initializing operation has been performed the predetermined number of times.

18. A method of erasing a flash EEPROM, comprising the steps of:
- performing a writing operation of a predetermined data in a plurality of memory cells of a memory cell array;
- performing an erasing operation to the plurality of memory cells;
- verifying whether the erasing operation is correctly performed; and
- extracting holes trapped in a tunnel oxide film.

19. A method according to claim 18, wherein each of the plurality of memory cells has a control gate, a floating gate, a source and a drain, and wherein said extracting step is performed to extract trapped holes by setting the control gate to a voltage which does not affect the trapped holes and the drain and the source are set to negative voltages.

20. A method according to claim 19, further comprising the step of determining whether an initializing operation composed of the writing operation, the erasing operation, and the verifying operation has been performed a predetermined number of times, wherein said extracting step is performed when it is determined that the initializing operation has been performed the predetermined number of times.

* * * * *